US009177878B2

(12) United States Patent
Brambilla et al.

(10) Patent No.: US 9,177,878 B2
(45) Date of Patent: Nov. 3, 2015

(54) METHOD FOR INDEXING DIES COMPRISING INTEGRATED CIRCUITS

(71) Applicant: STMICROELECTRONICS S.r.l., Agrate Brianza (IT)

(72) Inventors: Daniele Alfredo Brambilla, Sovico (IT); Fausto Redigolo, Oderzo (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 14/322,448

(22) Filed: Jul. 2, 2014

(65) Prior Publication Data

US 2014/0312878 A1    Oct. 23, 2014

Related U.S. Application Data

(62) Division of application No. 12/649,243, filed on Dec. 29, 2009, now Pat. No. 8,785,930.

(30) Foreign Application Priority Data

Dec. 30, 2008   (IT) .............................. MI2008A2344

(51) Int. Cl.
*H01L 21/66*      (2006.01)
*G01R 19/00*      (2006.01)
(Continued)

(52) U.S. Cl.
CPC ............ *H01L 22/20* (2013.01); *G01R 19/0092* (2013.01); *H01L 22/12* (2013.01); *H01L 23/544* (2013.01); *H01L 28/20* (2013.01);
(Continued)

(58) Field of Classification Search
CPC ......... H01L 22/20; H01L 22/12; H01L 28/20; G01R 19/0092

USPC ................ 430/311, 313, 322, 394; 438/5, 18; 324/76.11; 327/565
See application file for complete search history.

(56) References Cited

U.S. PATENT DOCUMENTS 4,402,042 A * 8/1983 Guttag .......................... 712/207
4,655,598 A    4/1987 Murakami et al.
(Continued)

FOREIGN PATENT DOCUMENTS

| EP | 1589578 | 10/2005 |
|---|---|---|
| JP | 2007081123 | 3/2007 |
| WO | 0154195 | 7/2001 |

OTHER PUBLICATIONS

Search Report for Italian Application No. MI20082344, Ministero dello Sviluppo Economico, Munich, Nov. 18, 2009, pp. 2.

*Primary Examiner* — Sheng Zhu
(74) *Attorney, Agent, or Firm* — Gardere Wynne Sewell LLP

(57) ABSTRACT

Indexing a plurality of die obtainable from a material wafer comprising a plurality of stacked material layers. Each die is obtained in a respective position of the wafer. A manufacturing stage comprises at least two steps for treating a respective superficial portion of the material wafer that corresponds to a subset of said plurality of dies using the at least one lithographic mask through the exposition to the proper radiation in temporal succession. The method may include providing a die index on each die which is indicative of the position of the respective die by forming an external index indicative of the position of the superficial portion of the material wafer corresponding to the subset of the plurality of dies including said die and may comprise a plurality of electronic components electrically coupled to each other by means of a respective common control line.

21 Claims, 12 Drawing Sheets

(51) Int. Cl.
*H01L 49/02* (2006.01)
*H01L 23/544* (2006.01)

(52) U.S. Cl.
CPC . *H01L2223/5444* (2013.01); *H01L 2223/5448* (2013.01); *H01L 2223/54433* (2013.01)

(56) References Cited

U.S. PATENT DOCUMENTS

| | | | |
|---|---|---|---|
| 5,294,812 A | 3/1994 | Hashimoto et al. | |
| 5,302,491 A * | 4/1994 | Akylas et al. | 430/311 |
| 5,760,421 A | 6/1998 | Takahashi et al. | |
| 6,043,101 A | 3/2000 | Stubblefield et al. | |
| 6,081,468 A * | 6/2000 | Taira et al. | 365/203 |
| 6,133,054 A | 10/2000 | Henson | |
| 6,284,413 B1 | 9/2001 | Adams | |
| 6,552,745 B1 * | 4/2003 | Perner | 348/308 |
| 6,738,294 B2 | 5/2004 | Layman et al. | |
| 6,893,883 B2 | 5/2005 | Hui et al. | |
| 7,348,682 B2 | 3/2008 | Brambilla et al. | |
| 7,393,703 B2 | 7/2008 | Anderson et al. | |
| 7,457,180 B2 | 11/2008 | Harris | |
| 2010/0163871 A1 | 7/2010 | Brambilla et al. | |

* cited by examiner

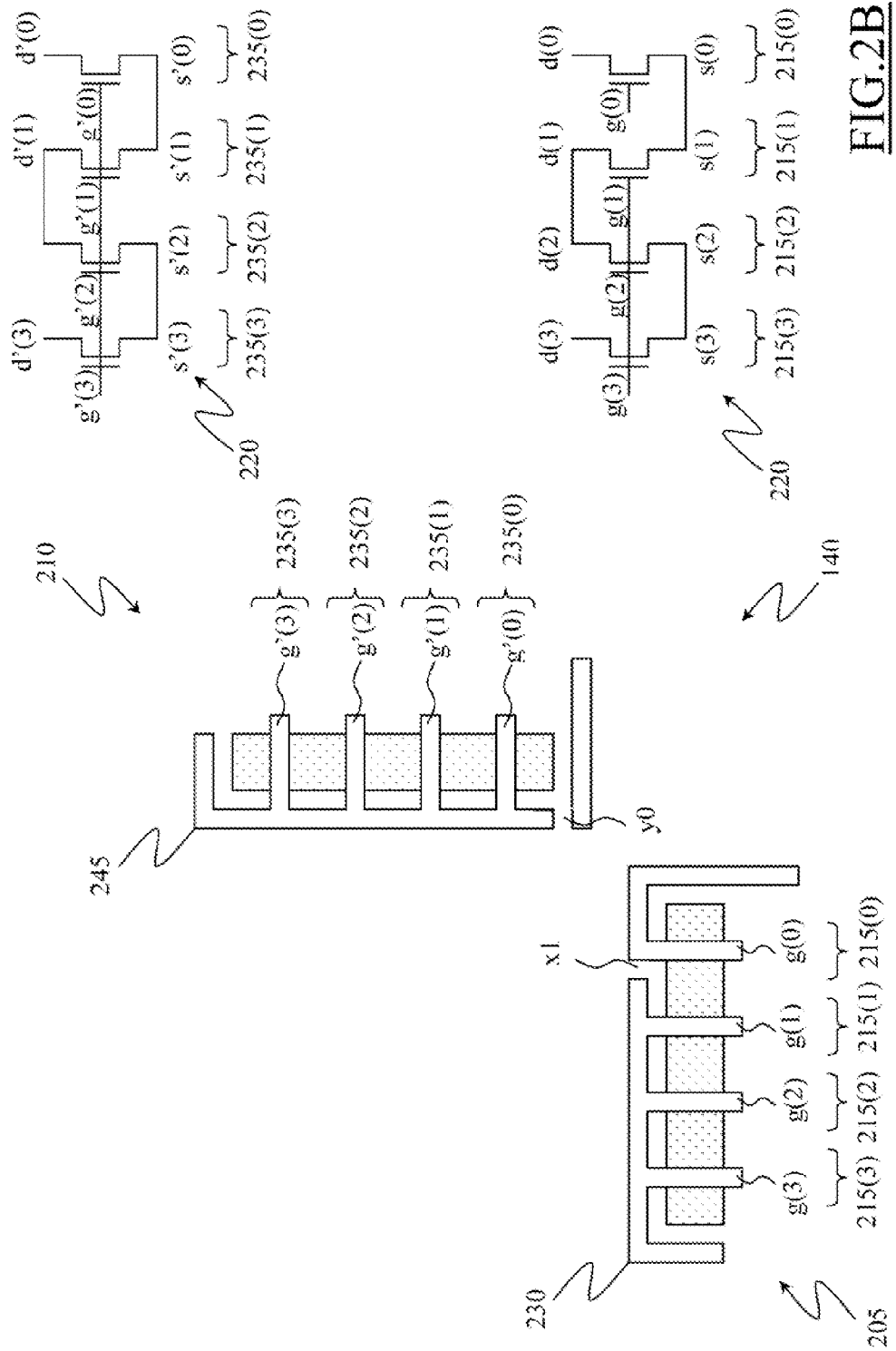

METHOD FOR INDEXING DIES COMPRISING INTEGRATED CIRCUITS

PRIORITY CLAIM

The present application is a Divisional of copending U.S. patent application Ser. No. 12/649,243, filed Dec. 29, 2009, which application claims the benefit of Italian Patent Application No. MI2008A002344, filed Dec. 30, 2008; all of the foregoing applications, are incorporated herein by reference in their entireties.

TECHNICAL FIELD

An embodiment of the present disclosure generally relates to electronic devices integrated in semiconductor dies, and particularly to the manufacturing thereof. More specifically, an embodiment of the present disclosure regards a method for indexing dies, which include integrated devices, obtained starting from a semiconductor material wafer.

BACKGROUND

Thanks to the modern integration technologies, it is possible to integrate micro-devices, such as electronic circuits, micro-mechanical structures and/or optical structures, in a die obtained from a semiconductor material (e.g., silicon) wafer. Particularly, the silicon wafer is subjected to a series of selective lithographic processes, at the end of which a plurality of replicas of the desired integrated devices are formed on the semiconductor wafer. At this point, the processed wafer is subjected to dicing operations, in order to obtain the desired dies; at the end of the dicing operations, each resulting die includes a corresponding integrated circuit. Typically, the dies are then encapsulated into respective packages, whose characteristics depend on the use the devices are destined to.

If the devices integrated in the dies are defective or subjected to faults during the operation, and the dies are returned to the manufacturer in order to carry out a fault analysis, it may be important to be capable of retrieving the original position of the device within the semiconductor wafer (i.e., before the dicing operations for obtaining the dies), since such information may allow one to manage the quality of the manufacturing process in an optimum way. Indeed, the performances, the reliability and different functional parameters (such as electric and/or optic parameters) of the devices integrated in each die may vary with the position of the device itself within the semiconductor wafer, for example because the crystallographic quality of the wafer material may vary with the position within the wafer. As a consequence, by means of analysis of such type, the manufacturer is capable of planning proper strategies for improving the manufacturing quality of the dies and the quality of the circuits integrated therein.

For this purpose, each die is provided with an indication—in jargon, "die index"—of the zone wherein such die was positioned within the semiconductor wafer before being subjected to the dicing operations.

At the present time, different indexing methods which exploit "visible" die indexes are known in the art, i.e., visible marks located on each die—for example on a top passivation layer in the stack of material layers of the wafer—during the manufacturing process. In this way, it may be possible to read a die index through a non-invasive inspection even when the electronic device integrated in the die is defective. For example, a die index formed by a number of an ordered sequence of numbers may be assigned to each die obtained from the wafer; such number may be placed in a peripheral portion of the die.

A process for manufacturing the dies starting from a semiconductor wafer typically comprises a sequence of stages. Photolithographic masks are typically employed during such process stages for defining shapes in the various layers of material forming the wafer. A photolithographic mask—briefly, mask—is a plate including very high definition photographic images (comprising opaque and transparent areas) of shapes and structures useful for implementing the device on the various material layers of the wafer.

In certain predetermined process stages, the wafer is covered with a photosensitive material layer, in jargon denoted "photosensitive resist" or "photoresist", and a mask properly aligned with the wafer is enlightened by means an optical system with radiation having wavelengths which are suitable for the exposure of the photoresist. Consequently, the images on the mask are projected and transferred on the photoresist covering the wafer. The exposed photoresist is then developed, generating on the wafer shapes that allow to identify the areas of material to be removed and those to be maintained.

The manufacturing process previously described may be carried out using a traditional projection system, in which the wafer is positioned and aligned with the required masks for the manufacturing of the devices on the wafer. As long as the size of wafer is relatively small, each mask includes a number of images equal to the number of dies to be obtained from the wafer, and the whole wafer is exposed to the lighting through such mask in a single step.

By means of such projection system it is possible to index the dies with a visible index, particularly forming the die indexes of all the dies obtainable from the wafer on one among the masks used during the manufacturing process.

The increasing in size of the semiconductor wafers has resulted in the introduction of step-by-step projection systems (in jargon, "wafer steppers"), by means of which the images of the mask required for the production of the devices are not projected in a single step, but instead are projected on the wafer in different consecutive steps.

A step-by-step projection system includes the optical system and an alignment system for aligning the optical system, the mask and the wafer in a step-by-step fashion. Particularly, the image projected by the mask typically covers an area that is a portion of the whole area of the wafer (in jargon, such portion is often referred to as "shot"). After each exposition, the wafer positioned under the optical system is shifted by an amount exactly equal to the size of the projection of the mask on the wafer.

The step-by-step projection systems allow obtaining a higher number of dies, starting from semiconductor wafers larger than the wafers used with the traditional projection systems. Thus, the masks used for the traditional projection systems are not compatible with the size of the semiconductor wafers that can be processed by means of the use of the step-by-step projection systems; consequently, using step-by-step projection systems it may not be possible to project the images of the visible indexes of all the dies of the wafer in at the same time (i.e., in a single step).

European Patent Application EP 1589578, which is incorporated by reference, describes a method for generating visible dies indexes adapted to be employed in the step-by-step projection systems. Briefly, on each die a pair of die indexes is generated, including a first index adapted to identify the position of the die within the wafer, and a second index adapted to identify the position assumed by the mask with respect to the wafer surface during the step in which the wafer portion including the die has been exposed. Such indexes may be implemented using a particular material layer formed on the semiconductor wafer during the preceding phases of the process, for example one among the metallic layers. For example, in one of the embodiments described in the patent application EP 1589578, the first index comprises a reference element and two further index elements whose positions relative to the reference element determine a pair of coordinates which identify the position of the die within the mask. The second index comprises instead a toothed reference structure in which each possible combination of pairs of teeth of the structure is associated with a particular position of the mask in the semiconductor wafer. Selectively etching a pair of teeth of the toothed reference structure, it is thus possible to register the position assumed by the mask with respect to the wafer surface during the step in which the portion of the wafer including the die has been exposed. In this way, by means of such two indexes results, it is possible to univocally retrieve the exact position of the die in the wafer before the dicing operations.

However, a solution of such type, and generally any solution making use of visible die indexes, may not be advantageous under all applications Indeed, since the majority of the dies are sold encapsulated in a respective package, in order to read a visible index it is necessary to open the package, with the risk of further damaging the die. Moreover, once the packaging has been opened, or even using infrared or x-ray sensing systems, distinguishing the structures forming the die indexes from the rest of the components forming the circuit integrated in the die may not be a simple operation, because of the very small size and the very large number of electronic devices which are actually integrated in a single die. A further drawback linked to the use of visible die indexes, which is correlated with the previously cited drawback, regards the costs—in terms of time, too—required for carrying out inspection operations of such type, which may be very high; particularly, a visual inspection of such type, other than requesting sometimes the opening of the packaging, is hardly executable in an automated way, often requiring instead the use of an expert operator, who knows the topology of the integrated device.

Alternative indexing methods provide instead the integration of die indexes formed by non-volatile memory elements—for example, flash memory cells—in each die, adapted to store the information regarding the coordinates of the die in the semiconductor wafer. For example, during a test phase of the circuit integrated in the die, in the memory elements of the die, indexes of each die are stored as a numeric string corresponding to the coordinates of the die.

However, even the solutions of such type may increase the costs, and particularly the costs of the manufacturing process of the dies. Indeed, in order to integrate memory cells in the die, it may be necessary to carry out expensive dedicated process steps, and occupy active portions within the die. In addition, a solution of such type may make the die even more to faults; in case the faults are such to completely impair the circuit integrated in the chip, the information stored in the memory elements is lost.

SUMMARY

An embodiment of the present disclosure overcomes the previously mentioned drawbacks.

An embodiment of the present disclosure regards a method for indexing a plurality of dies obtainable from a material wafer comprising a plurality of stacked material layers. Each die is obtained in a respective position of the wafer; the plurality of dies is obtained by means of a manufacturing process performed in at least one manufacturing stage using at least one lithographic mask for treating a surface of the material wafer trough an exposition to a proper radiation. Said at least one manufacturing stage comprises at least two steps for treating a respective superficial portion of the material wafer that corresponds to a subset of said plurality of dies using the at least one lithographic mask through the exposition to the proper radiation in temporal succession. The method includes providing a die index on each die which is indicative of the position of the respective die by forming an external index indicative of the position of the superficial portion of the material wafer corresponding to the subset of the plurality of dies including said die. Said forming the external index comprises forming in a set of material layers of the die a first reference structure adapted to define a mapping of the superficial portions of the wafer; said first reference structure comprises a plurality of electronic components electrically coupled to each other by means of a respective common control line. The method further comprises interrupting the control line in a position based on the position of the superficial portion corresponding to the subset of the plurality of dies including the die.

A further embodiment of the present disclosure regards a semiconductor die obtained by a material wafer comprising a plurality of stacked material layers.

BRIEF DESCRIPTION OF THE DRAWINGS

One or more embodiments of the present disclosure, as well as features and advantages thereof, will be best understood by reference to the following detailed description, given purely by way of a non-restrictive indication, to be read in conjunction with the accompanying drawings. In this respect, it is expressly intended that the figures are not necessary drawn to scale and that, unless otherwise indicated, they are intended to conceptually illustrate the structures and procedures described herein. Particularly:

FIGS. 2A-2C are planar views of external indexes of dies of the wafer of FIG. 1B during a stage of the manufacturing process of the dies according to an embodiment of the present disclosure;

DETAILED DESCRIPTION

Figure 1A:
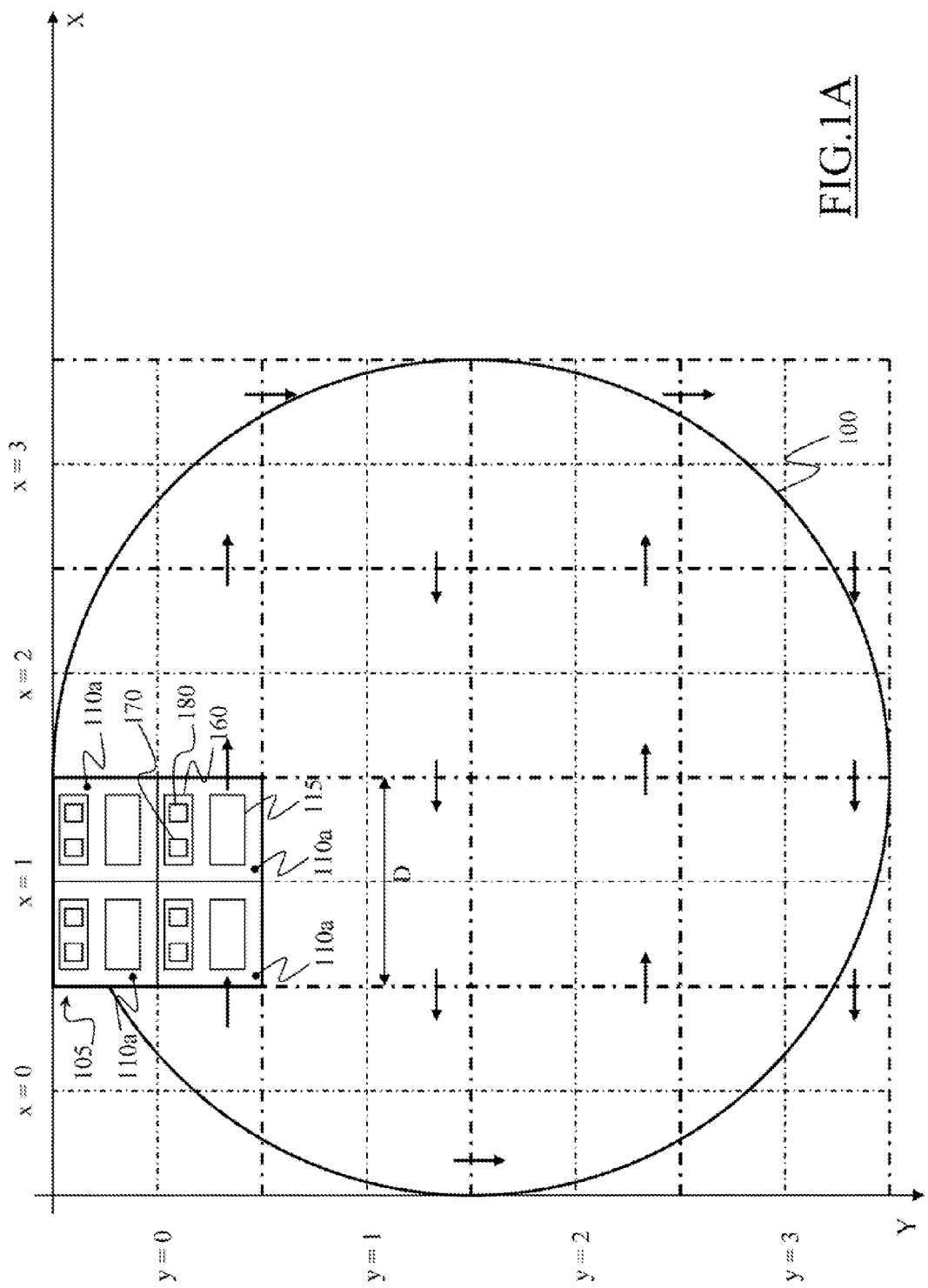
FIG. 1A illustrates a semiconductor wafer aligned with a photolithographic mask during a process for the manufacturing of dies wherein an embodiment of the present disclosure may be applied.

Referring in particular to FIG. 1A, it is schematically illustrated a semiconductor wafer 100 aligned to a photolithographic mask 105 during a process for manufacturing dies from the wafer 100 wherein an embodiment of the present disclosure may be applied. The dies are represented by areas of the wafer 100 wherein the integrated electronic devices are formed.

The manufacturing process is carried out in a plurality of stages, during which different masks 105 are employed for selectively defining the material layers stacked on the wafer 100 which form the integrated circuits of the dies. A generic mask 105 includes a set of images 110a traced on its surface for the manufacturing of a prescribed number of dies on the wafer 100. In the considered example, such number is equal to four; particularly, the mask 105 is subdivided in four portions, each one including an image 110a dedicated to the manufacturing of a respective die on the wafer 100.

Each image 110a includes a first portion comprising geometric configurations—formed by opaque and transparent areas—required for defining the integrated circuits of the dies in the material layers of the mask 100 that are processed in the stage making use of the mask 105. Such first portion of the image 110a, in the following denoted with the term of "circuit image", is identified in FIG. 1A with the reference 115.

During a stage of the manufacturing process in which the mask 105 is employed, the wafer 100 is covered by a photoresist and the mask 105, aligned to the wafer covered by the photoresist, is enlightened by means of a light source corresponding to a proper wavelength range, for the purpose of exposing the photoresist layer with the image 110a projected by the mask 105.

Using a step-by step projection system, the wafer 100 is shifted under the mask 105, which mask is enlightened more times. In this way the photoresist layer is completely exposed in a plurality of steps (in the considered example, sixteen steps). In greater details, considering the mask 105 of the example of FIG. 1A comprising four images 110a, the process stage exploiting the mask is comprised by sixteen distinct steps, for a total of sixty four images projected on the wafer 100 according to a bi-dimensional arrangement (as shown by the arrows in FIG. 1A). The ratio between the area of the images 110a of the mask 105 and the area of the images projected on the wafer 100 depends on the optical system of the step-by-step projection system; in the considered example, such ratio is 1:1.

Each step performed during the considered process stage corresponds to a particular position of the wafer 100 with respect to the mask 105. The shifting of the wafer 100 may be controlled in a precise way by means of a positioning program loaded in the step-by-step projection system.

According to the specific geometry of the wafer 100 and of the mask 105, at a first step (step 1) the mask 105 is projected on the wafer 100 in a partial way. At the subsequent step (step 2) the wafer 100 is translated along an x axis by a prescribed distance D (equal to the width of the mask 105 that is projected on the surface of the wafer 100) for exposing a portion of the wafer 100 which is adjacent to the portion exposed in the previous step. In a similar way, at the two following steps (steps 3, 4) the wafer 100 is translated along the x axis by the distance D, for exposing the portion of the wafer 100 which is adjacent to the portion exposed in the previous step. According to the considered example, at the step 5 the wafer 100 is translated along an y axis, orthogonal to the x axis, by the distance D; at the steps 6, 7 and 8 the wafer 100 is shifted again along the x axis, but in the opposite direction with respect to that corresponding to the steps 2-4, and so on. Using as reference system the axis x and y, and associating a pair of coordinates (x,y) with respect to such axis to the position of the mask 105, the sequence of steps of the generic process stage implies the mask 105 assuming the following (ordered) positions: (0,0)-(1,0)-(2,0)-(3,0)-(3,1)-(2,1)-(1,1)-(0,1)-(0,2)-(1,2)-(2,2)-(3,2)-(3,3)-(2,3)-(1,3)-(0,3).

Figure 1B:
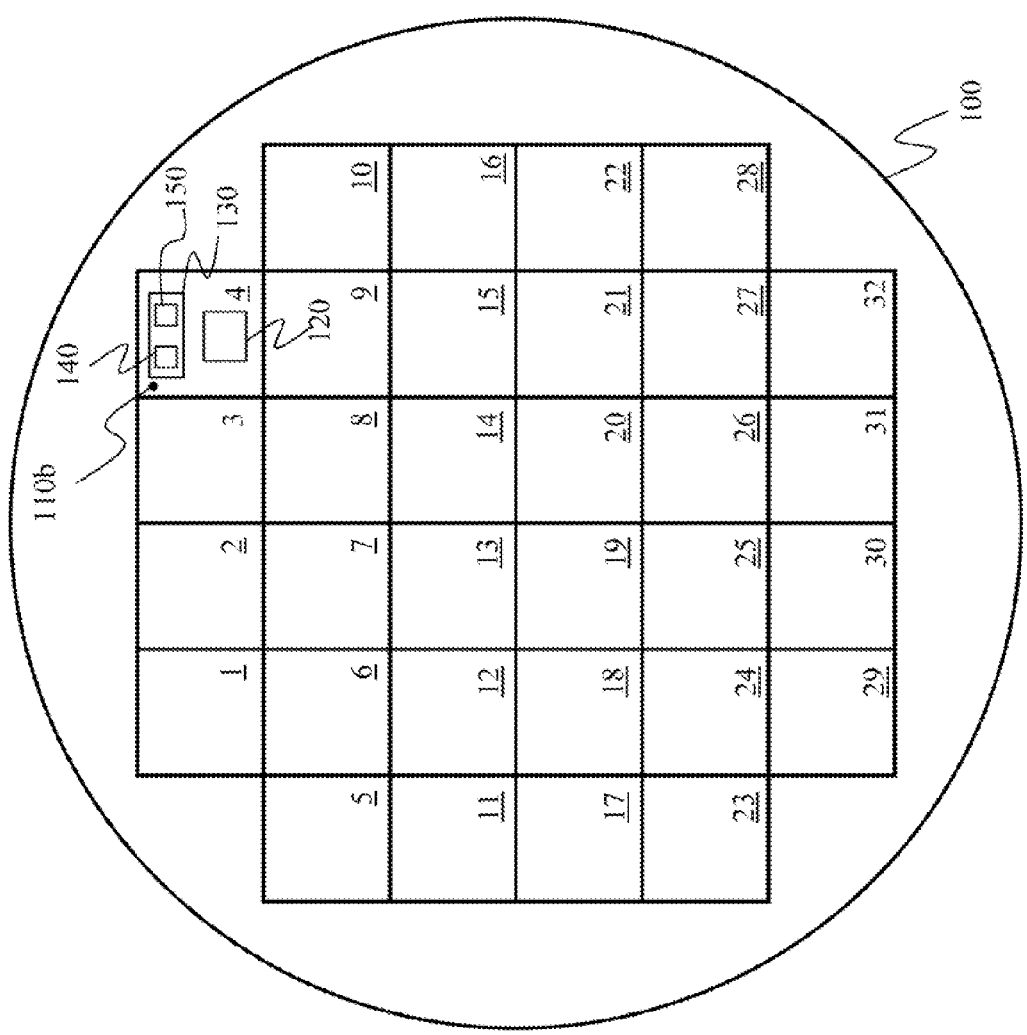
FIG. 1B illustrates the wafer of FIG. 1A at the end of the manufacturing process.

FIG. 1B illustrates the wafer 100 at the end of the manufacturing process. Particularly, the final result of the manufacturing process on the wafer 100 includes a bidimensional arrangement of dies 110b, obtained by means of the exposition—in the previously described step-by-step modality—of the portions of the wafer 100 area through the plurality of masks used during the various stages of the process. Particularly, each die 110b comprises a respective integrated circuit—identified in the figure with the reference 120—obtained by means of the exposition of the wafer 100 through the circuit images 115 included in the images 110a of the masks 105 used during the process stages.

At each process stage, by exposing the wafer 100 in sixteen steps through a respective mask 105 including four images 110a, thirty two dies 110b are obtained. In FIG. 1B, each die 110b is identified by a respective reference 1-32.

In order to be capable of recovering the mask position 1-16 of the generic die 110b within the wafer 100 even after the dicing operations, on each die 110b a respective die index is generated, which die index is identified with the reference 130.

Each die index 130 is formed in turn by two sub-indexes, and particularly by a first index denoted "external index"—identified in the figure with the reference 140—and by a second index denoted "internal index"—identified in the figure with the reference 150.

The external index 140 of a generic die 110b allows identifying the position assumed by the mask 105 with respect to the wafer 100 when such die has been exposed—through the mask—to the enlightening during the manufacturing process. In other words, thanks to the external index 140 it is possible to determine the step of the manufacturing process in which the mask 105 has been exploited for manufacturing the die 110b indexed by such external index 140. In the considered example, the number of such steps is equal to sixteen—indeed, the step-by-step projection system uses a same mask 105 sixteen times during each process stage—and thus the external index 140 may assume sixteen different values.

The internal index 150 of a generic die 110b allows instead to identify the position of the die itself with respect to the mask 105—i.e., with respect to the image of the mask projected on the wafer. In each step of the process stage that makes use of a mask 105, such mask 105 is adapted to define a set of adjacent dies 110b at the same time—in the considered example, four dies. By means of the internal index 150 located on a generic die 110b it is possible to distinguish the position of such die 110b among those of the other dies 110b belonging to the set defined by the mask 105 in the same step.

As a consequence, making reference to the considered example, the die 110b having the position 1 in the wafer 100 illustrated in FIG. 1B has:
  an external index 140 having a value equal to (1,0), corresponding to the step 2 of the manufacturing stage during which the mask 105 is located at the coordinates (1,0); and an internal index 150 having a value equal to 3, corresponding to the third image 110a projected by the mask 105, i.e. the bottom left image.

Making reference to the considered example, the die 110b having the position 4 in the wafer 100 illustrated in FIG. 1B has:

an external index 140 having a value equal to (2,0), corresponding to the step 3 of the manufacturing stage during which the mask 105 is located at the coordinates (2,0); and an internal index 150 having a value equal to 4, corresponding to the fourth image 110a projected by the mask 105, i.e. the bottom right image.

As will become more clear in the following description, according to an embodiment of the present disclosure the external index 140 of each die 110b is an integrated electronic circuit—obtained by means of photolithographic manufacturing of the material layers of the wafer 100—adapted to store the position information in a non-volatile way.

Making again reference to the FIG. 1A, the die index 130 is generated by means of the same masks 105 used for generating the integrated circuits 120 during the various process stages. For this purpose, the image 110a of each mask 105 includes a second portion comprising geometric configurations adapted to define the die index 130 in the material layers of the wafer 100 that are processed in the process stage that makes use of the mask 105. Such second portion of the image 110a, denoted in the following with the term "index image", is identified in FIG. 1A with the reference 160. Each index image 160 comprises in turn a first reference image 170 for the definition of the external index 140 and a second reference image 180 for the definition of the internal index 150.

Although in FIG. 1A the sizes of the circuit images 115 are comparable to the sizes of the index images 160, the ratio between such sizes may be different, for example, where the die index 130 is smaller than the integrated circuit 120.

In the following of the present disclosure will be described in greater detail how the external index 140 is realized according to an embodiment of the present disclosure. Particularly, making reference to the FIGS. 2A-2C, the structures of several example external indexes 140 will be illustrated by means of a planar view during a stage of the manufacturing process of the dies 110b.

According to an embodiment of the present disclosure, the external index 140 includes a double array of electronic devices, i.e., a first array—identified in the figures with the reference 205—adapted to indicate the position of the mask 105 on the x axis, and a second array—identified in the figures with the reference 210—adapted to indicate the position of the mask 105 on the y axis.

Particularly, the array 205 comprises a number of electronic components equal to the number of different values the x coordinate of the mask 105 position may assume on the x axis (in the considered example, four, i.e., x=0, 1, 2, 3), while the array 210 comprises a number of electronic components equal to the number of different values the y coordinate of the mask 105 position may assume on the y axis (in the considered example, four, i.e., y=0, 1, 2, 3).

According to an embodiment of the present disclosure, the electronic components forming each array 205 and 210 are integrated n-channel MOS transistors. As will be more clear in the following of the present description, the whole structure of the two arrays 205, 210 forming the external index 140 may be used for registering a generic position of the mask 105 relative to the semiconductor wafer in the reference system defined by the x and y axes of FIG. 1A.

Figure 2A:
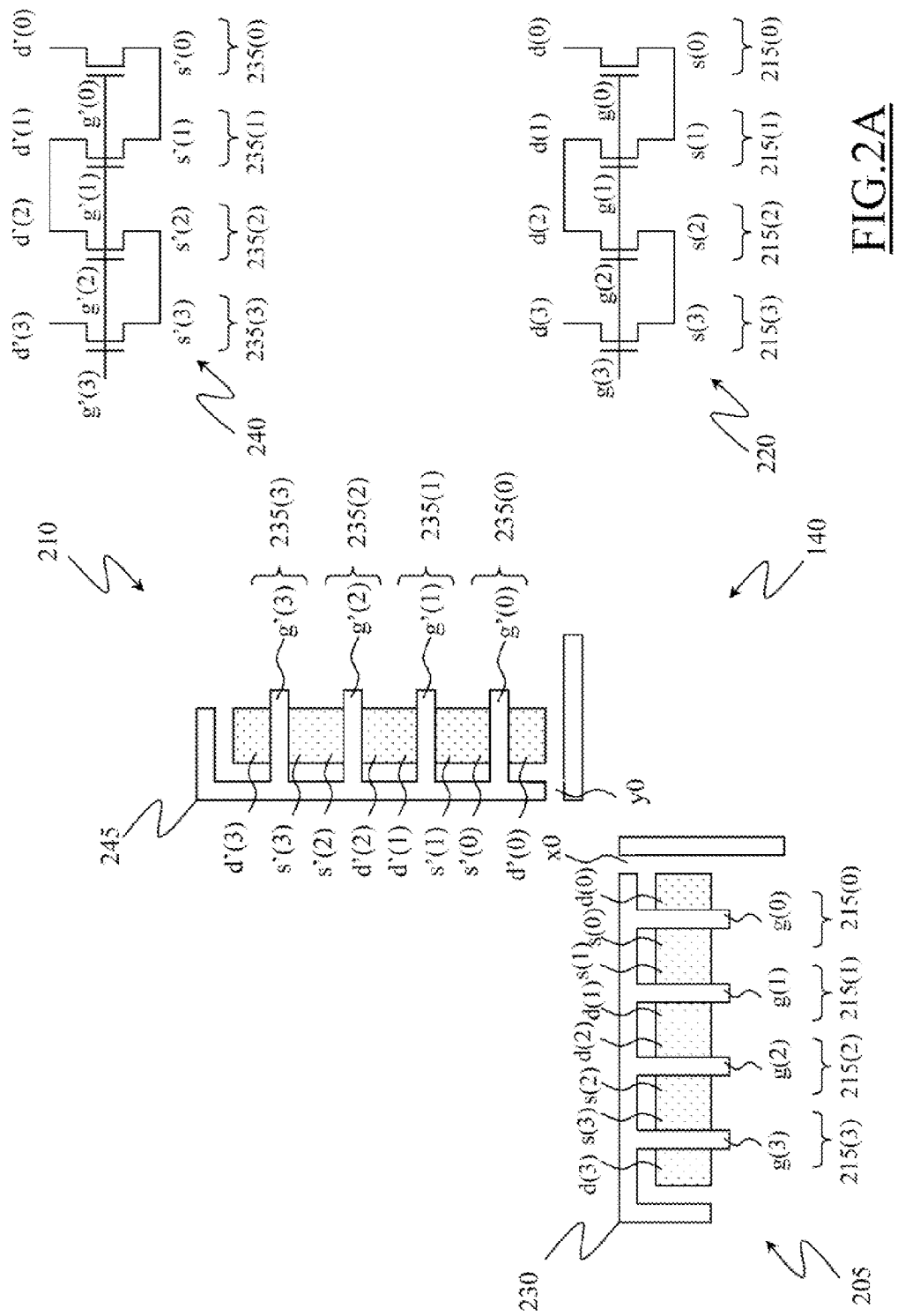

FIG. 2A illustrates in detail the structure of an external index 140 at the end of one of the stages of the manufacturing process of the dies 110b according to an embodiment of the present disclosure. Particularly, FIG. 2A illustrates the structure of such index at the end of a process stage adapted for the generation of the transistors on the semiconductor wafer.

As may be observed in FIG. 2A, the array 205 is formed by a plurality of transistors 215(i) (i=0, 1, n, with n equal to 3 in the considered example). In detail, a first transistor 215(0) of the array has a drain region d(0) realized by means of diffusion in the semiconductor wafer, a gate terminal g(0) realized in polysilicon, and a source region s(0) also realized by means of diffusion. The following transistor 215(1) in the array has the source region s(1) that coincides with the source region s(0) of the previous transistor 215(0), the gate terminal g(1) realized in polysilicon and the drain region d(1) that coincides with the drain region d(2) of the subsequent transistor 215(2) in the array. Such transistor 215(2) has the gate terminal g(2) realized in polysilicon, and the source region s(2) that coincides with the source region s(3) of the following transistor 215(3) in the array. In other words, as may be observed in the equivalent circuit indicated with the reference 220, the array 205 is formed by an ordered sequence of transistors 215(i) alternatively having the source and drain regions in common. All the gate terminals of the transistors 215(i) are coupled to a common gate line realized in polysilicon, identified in figure with the reference 230.

The array 210 is structured in a way similar to the array 205. Such array is formed by a plurality of transistors 235(j) (j=0, 1, ... m, with m equal to 3 in the considered example) as well. In detail, a first transistor 235(0) of the array has a drain region d'(0) realized by means of diffusion in the semiconductor wafer, a gate terminal g'(0) realized in polysilicon, and a source region s'(0) realized by means of diffusion, too. The following transistor 235(1) in the array has the source region s'(1) that coincides with the source region s'(0) of the previous transistor 235(0), the gate terminal g'(1) realized in polysilicon and the drain region d'(1) that coincides with the drain region d'(2) of the subsequent transistor 235(2) in the array. Such transistor 235(2) has the gate terminal g'(2) realized in polysilicon, and the source region s'(2) that coincides with the source region s'(3) of the following transistor 235(3) in the array. Even in this case, as may be observed in the equivalent circuit indicated with the reference 240, the array 210 is formed by an ordered sequence of transistors 235(j) alternatively having the source and drain regions in common. All the gate terminals of the transistors 235(i) are coupled to a common gate line realized in polysilicon, identified in figure with the reference 245.

The definition of the gate lines 230, 2405, the source and drain regions d(i), d'(j), s(i), s'(j) of the transistors 215(i), 235(j), and the gate regions—non visible in figure—of such transistors have been carried out in the previous stages of the manufacturing process making use of the first reference images 170 located in the various masks 150 used during such process stages.

By making the array 205 correspond to the x axis, and the array 210 to the y axis, it may be possible to associate with each pair of transistors 215(i), 235(j) a corresponding pair of coordinates (x,y) in the reference system determined by such axis, for example according to the relationship (x=i, y=j).

According to an embodiment of the present disclosure, in order to register a position of the mask 105 corresponding to the pair of generic coordinates x=i, y=j:

the gate line 230 is interrupted in a portion thereof included between the gate terminal g(i) of the transistor 215(i) and the gate terminal g(i−1) of the transistor 215(i−1); and the gate line 245 is interrupted in a portion thereof included between the gate terminal g'(j) of the transistor 235(j) and the gate terminal g'(j−1) of the transistor 235(j−1).

If the coordinate x=I=0, then the portion of the gate line 230 is interrupted before the gate terminal g(0) of the transistor 215(0); if the coordinate y=j=0, then the gate line 245 is interrupted before the gate terminal g'(0) of the transistor 235(0).

The external index 140 illustrated in the FIG. 2A corresponds to the pair of coordinates (x=0, y=0). Indeed, the gate line 230 has a first interruption—identified with the reference $x_0$—located before the gate terminal g(0) of the transistor 215(0), while the gate line 245 has a second interruption—identified with the reference $y_0$—located before the gate terminal g'(0) of the transistor 235(0). In this situation, the gate terminals of all the transistors 215(i) are coupled to a same portion of the gate line 230; similarly, the gate terminals of all the transistors 235(j) are coupled to a same portion of the gate line 245, too.

FIG. 2B illustrates instead the external index 140 corresponding to the pair of coordinates (x=1, y=0). In this case, the gate line 230 has a first interruption—identified with the reference x1—between the gate terminal g(1) of the transistor 215(1) and the gate terminal g(0) of the transistor 215(0), while the gate line 245 has a second interruption $y_o$ having the same position of the interruption $y_0$ illustrated in FIG. 2A. In this situation, the gate terminals of all the transistors 235(j) are coupled to a same portion of the gate line 245; furthermore, while the gate terminals of the transistors 215(1), 215(2) and 215(3) are coupled to a first portion of the gate line 230, the gate terminal of the transistor 215(0) is coupled to a second portion of the gate line 230, separated from the first portion by means of the interruption x1.

Figure 2C:
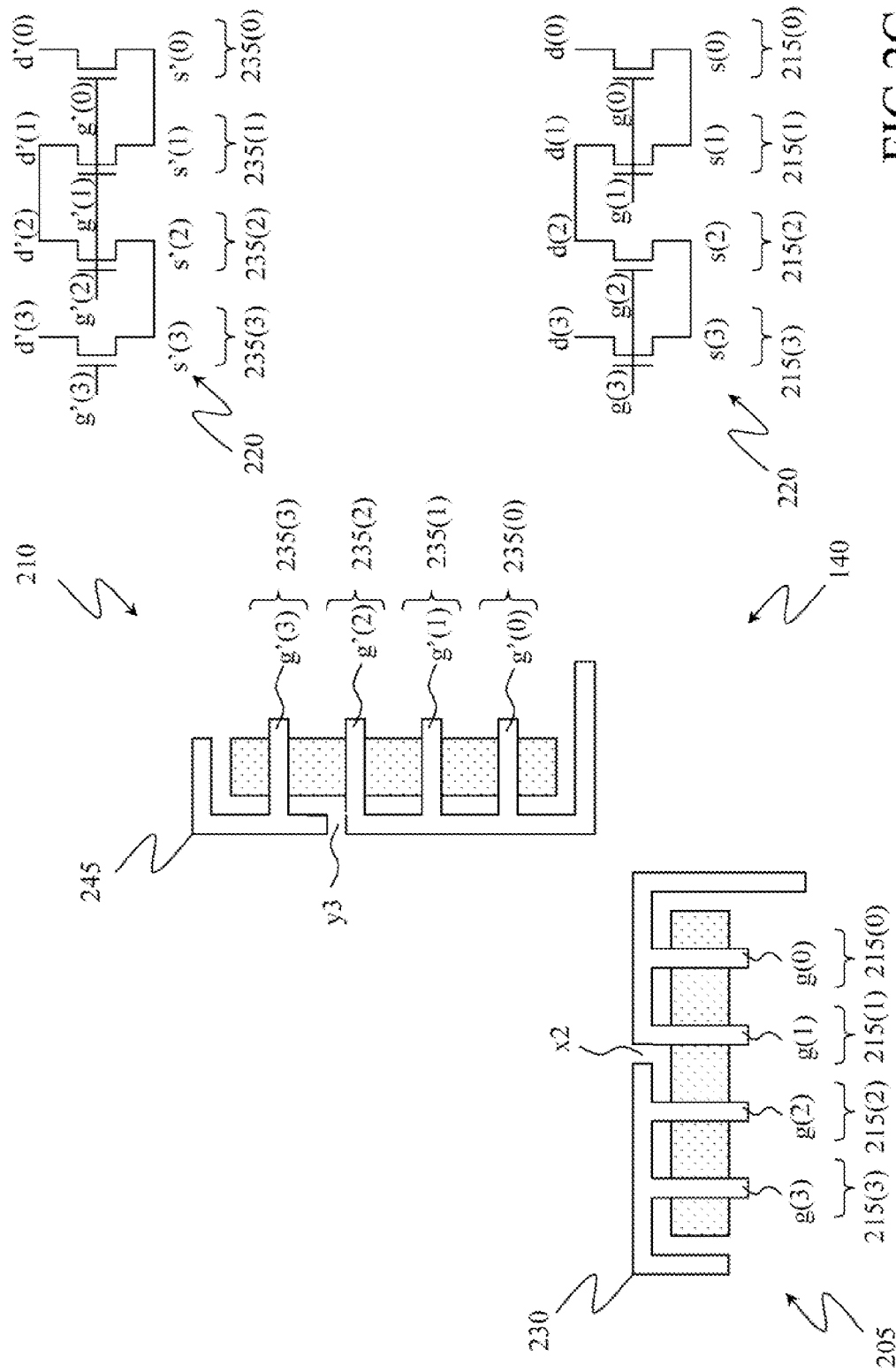

Lastly, the FIG. 2C illustrates the external index 140 corresponding to the pair of coordinates (x=2, y=3). In this case, the gate line 230 has a first interruption—identified with the reference x2—between the gate terminal g(2) of the transistor 215(2) and the gate terminal g(1) of the transistor 215(1), while the gate line 245 has a second interruption—identified with the reference y3—between the gate terminal g'(3) of the transistor 235(3) and the gate terminal g'(2) of the transistor 215(2). In this situation, the gate terminals of the transistors 215(0) and 215(1) are coupled to a first portion of the gate line 230, while the gate terminals of the transistors 215(2) and 215(3) are coupled to a second portion of the gate line 230, separated from the first portion by means of the interruption x2. Moreover, while the gate terminals of the transistors 235(0), 235(1) and 235(2) are coupled to a first portion of the gate line 245, the gate terminal of the transistor 235(3) is coupled to a second portion of the gate line 245, separated from the first portion by means of the interruption y3.

Figure 3:
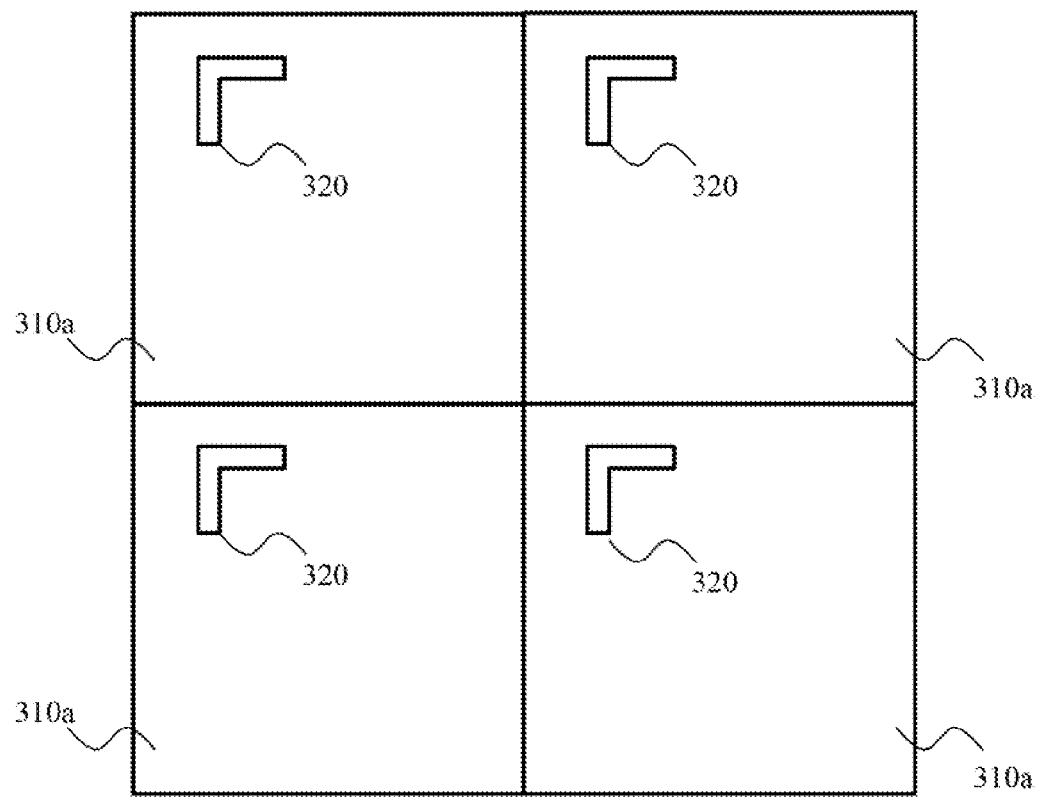
FIG. 3 illustrates a service lithographic mask usable during the manufacturing process of the dies according to an embodiment of the present disclosure.

According to an embodiment of the present disclosure, in order to register a position of the mask 105, i.e., a pair of coordinates (x, y), and obtaining the external index 140 structure illustrated in the previous figures, a service lithographic mask of the type illustrated in FIG. 3 is employed, which is superimposed on the mask 105 used for generating the gate lines 230 and 245.

Each first reference image 170 included in the mask 105 used for generating the gate lines 230 and 245 comprises geometric arrangements adapted to define the gate lines 230, 245 in their completeness (i.e., without any interruption). The service mask, identified in figure with the reference 300, includes a set of identical images 310a traced on its surface. The number of the images 310a coincides with the number of images 110a traced on each one among the masks 105 employed during the various stages of the manufacturing process (in the example at issue, such number is equal to four). Each image 310a is totally opaque to the light, except for a transparent window having an L shape, identified with the reference 320.

During the manufacturing stage of the gate lines 230 and 245, denoted "indexing stage", the surface of the wafer 100 is coated by a photoresist layer, and subsequently enlightened in a step-by-step fashion through the service mask 300 superimposed on the mask 105.

At the first step, corresponding to the coordinates (x=0, y=0), the service mask 300 is exactly superimposed on the mask 105, with each one of the images 310a that is superimposed on a corresponding die 110b of the wafer 100 (with the exclusion of the images corresponding to possible incomplete dies close to the border of the wafer).

Each window 320 is arranged in such a way that at the first step of the indexing stage such window is superimposed on the external index 140 of a corresponding die 110b. In detail, at the first step each window 320 is superimposed on the portion of the gate line 230 preceding the gate terminal g(0) of the transistor 215(0)—corresponding to the coordinate x=0—, and on the portion of the gate line 245 preceding the gate terminal g'(0) of the transistor 235(0)—corresponding to the coordinate y=0.

After that the portion of the wafer 100 covered by the service mask 300 superimposed on the mask 105 has been enlightened, the mask 105 is moved along the x axis by the distance D, for reaching the coordinates corresponding to the next step—i.e., the coordinates (1,0); unlike the mask 105, the service mask 300 is instead moved along the x axis by a distance lower than the distance D, and particularly in such a way that the window is now superimposed on the portion of the gate line 230 comprised between the gate terminal g(1) of the transistor 215(1)—corresponding to the coordinate x=1—and the gate terminal g(0) of the transistor 215(0)—corresponding to the coordinate x=0—and on the portion of the gate line 245 preceding the gate terminal g'(0) of the transistor 235(0)—corresponding to the coordinate y=0.

According to an embodiment of the present disclosure, the indexing stage continues in a similar way for the other steps required to completely expose the wafer 100, with the projection system that at each step shifts the service mask 300 by a distance equal to the prescribed distance D modified by an amount depending on the coordinates (x, y) corresponding to such step. Particularly, at the generic step corresponding to the coordinates x=i and y=j, with i, j different than zero, the service mask 300 is shifted with respect to the position assumed by the mask 105 by an amount along the x and/or y axis such that the window 320 of each image 310a is superimposed on the portion of the gate line 230 comprised between the gate terminal g(i) of the transistor 215(i) and the gate terminal g(i−1) of the transistor 215(i−1), and on the portion of the gate line 245 comprised between the gate terminal g'(j) of the transistor 235(j) and the gate terminal g'(j−1) of the transistor 235(j−1). If the coordinate x=I is equal to zero, the portion of the gate line 230 which is superimposed by the window 320 is the one preceding the gate terminal g(0) of the transistor 215(0); if instead it is the coordinate y=j to be equal to zero, the portion of the gate line 245 which is superimposed by the window 320 is the one preceding the gate terminal g'(0) of the transistor 235(0).

Figure 4:
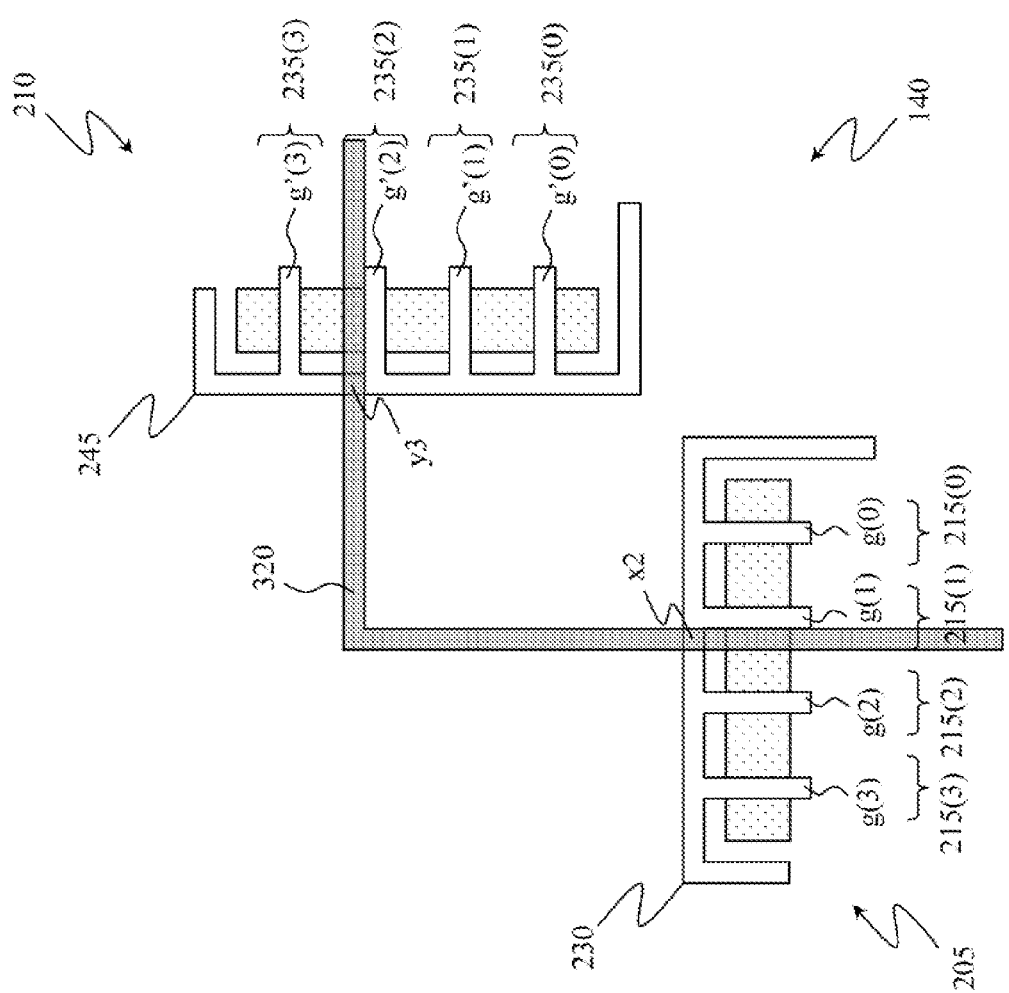
FIG. 4 is a planar view of an external index of a die during an indexing stage according to an embodiment of the present disclosure.

For the sake of clarification, FIG. 4 illustrates the situation relating the fourteenth step of the indexing stage, corresponding to the coordinates (x=2, y=3). In this case, the window 320 is superimposed on the portion of the gate line 230 comprised between the gate terminal g(2) of the transistor 215(2) and the gate terminal g(1) of the transistor 215(1), and on the portion of the gate line 245 comprised between the gate terminal g'(3) of the transistor 235(3) and the gate terminal g'(2) of the transistor 235(2).

At the end of the last step of the indexing stage, the photoresist layer covering the surface of the wafer 100 is developed, uncovering in each external index 140 of each die 110b the contours of the gate lines 230, 245 and the two portions thereof corresponding to the pair of coordinates (x,y) of the position assumed by the mask 105 for fabricating such die 110b. At this point, the layer of material used for the formation of the gate lines 230, 245 (in the considered example, a polysilicon layer) is selectively etched, and the portions that are not covered by the photoresist are removed.

At the end of this operation, in each external index 140 of each die 110b it is formed a gate line 230 comprising an interruption xi determined by the x coordinate of the mask's position, and a gate line 245 comprising an interruption yj determined by the y coordinate of the mask's position.

For example, making reference to the case illustrated in FIG. 4, the position of the window 320 corresponding to the coordinates (x=2, y=3) allows one to obtain the external index 140 illustrated in FIG. 2C, wherein the gate line 230 exhibits an interruption x2 between the gate terminal g(2) of the transistor 215(2) and the gate terminal g(1) of the transistor 215(1), and the gate line 245 exhibits an interruption y3 between the gate terminal g'(3) of the transistor 235(3) and the gate terminal g'(2) of the transistor 235(2).

After the indexing stage, the external indexes 140 are subjected to further process stages.

Figure 5:
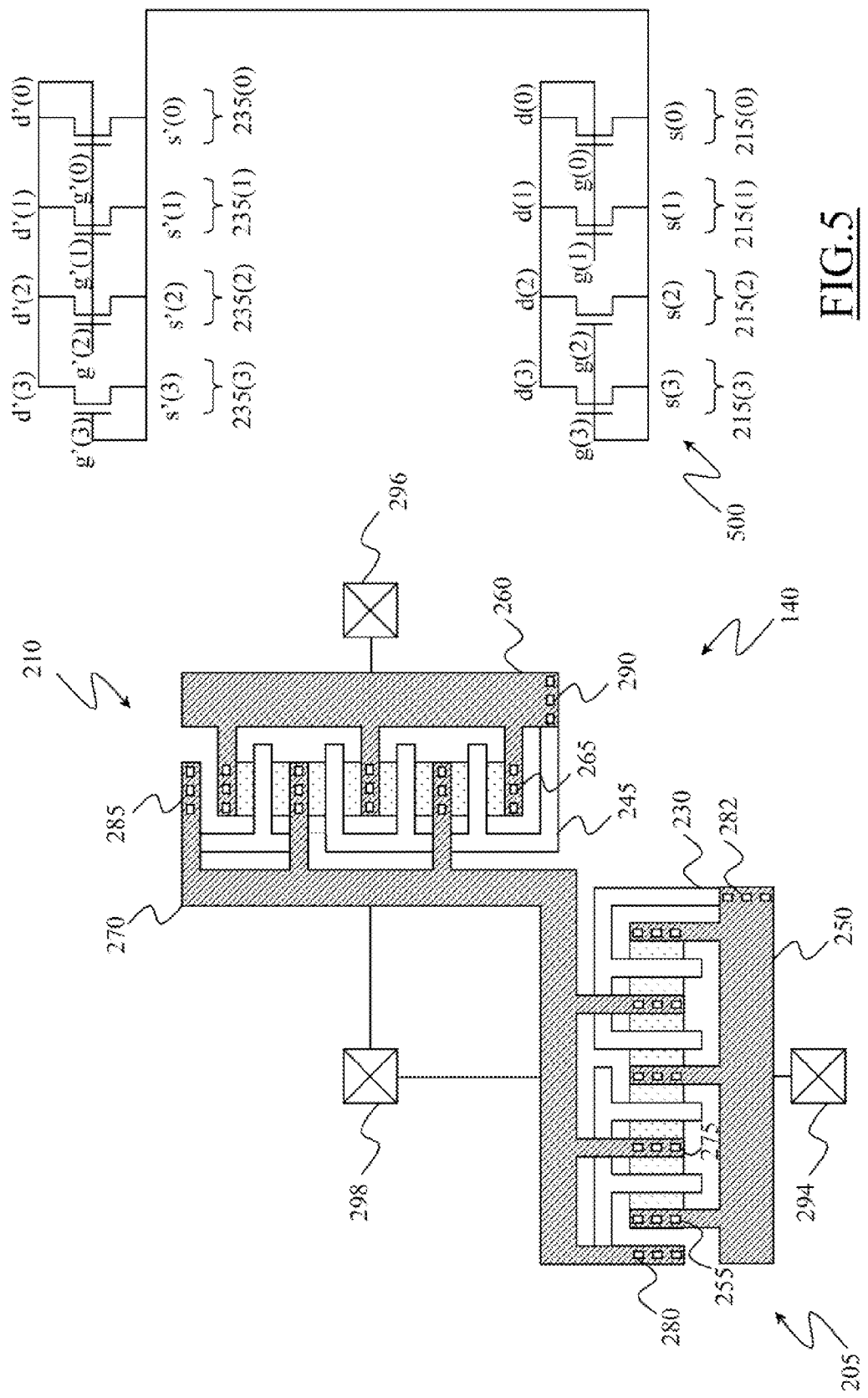
FIG. 5 is a planar view of the external index of FIG. 4 during a subsequent stage of the manufacturing process.

Particularly, FIG. 5 illustrates in detail the structure of the external index 140 corresponding to the coordinate (x=2, y=3) at the end of a subsequent process stage, and particularly at the end of the process stage adapted to the generation of the metallic connection lines on the semiconductor material wafer.

At this point of the manufacturing process, the drain regions d(0)-d(n) of the transistors 215(i) forming the array 205 are coupled to a common drain region, identified in the figure with the reference 250. Particularly, the drain line 250 is realized starting from a metallic layer deposed on the semiconductor wafer and defined by means of the first reference images 170 on the various masks 105 used in the previous process stages. The connection between the drain line 250 and the various drain regions d(0)-d(n) of the transistors 215(i) is provided by proper contacts, identified in the figure with the reference 255.

In the same way, also the drain regions d'(0)-d'(n) of the transistors 235(j) forming the array 210 are coupled to a common drain line, identified in figure with the reference 260, by means of contacts identified in figure with the reference 265.

The source regions s(0)-s(n) of the transistors 215(i) forming the array 205 and the source regions s'(0)-s'(m) of the transistors 235(j) forming the array 210 are coupled to a common source line, identified in FIG. 5 with the reference 270. The source line 270 is realized starting from a metallic layer deposed on the semiconductor material wafer and defined by means of the first reference images 170 on the various masks 105 used in the previous process stages. The connection between the source line 270, the various source regions s(0)-s(n) of the transistors 215(i) and the source regions s'(0)-s'(m) of the transistors 235(j) is provided by proper contacts, identified in figure with the reference 275.

According to an embodiment of the present disclosure, a first end of the gate line 230 of the array 205 is coupled to the source line 270 by means of contacts identified in figure with the reference 280, and a second end of the gate line 230 is coupled to the drain line 250 by means of further contacts identified in figure with the reference 282.

In the same way, a first end of the gate line 245 of the array 210 is coupled to the source line 270 by means of contacts identified in figure with the reference 285, and a second end of the gate line 245 is coupled to the drain line 260 by means of further contacts identified in figure with the reference 290.

The equivalent circuit of the arrays 205 and 210 is illustrated in FIG. 5 with the reference 292. As can be observed by the circuit 292, at this stage of the manufacturing process each array 205, 210 is formed by a set of transistors coupled in parallel to each other.

In detail, the transistors 215(i) of the array 205 have the drain terminals—identified with the same reference of the corresponding drain regions d(0)-d(3)—coupled to each other, and the source terminals—identified with the same reference of the corresponding source regions s(0)-s(3)—coupled to each other. As previously described, in the external index 140 corresponding to the coordinate (x=2, y=3) the gate terminals g(0), g(1) are coupled to each other; in the same way, also the gate terminals g(2) and g(3) are coupled to each other. Moreover, the gate terminals g(2) and g(3) are coupled to the source terminals s(0)-s(3), while the gate terminals g(0) and g(1) are coupled to the drain terminals d(0)-d(3) of the array 205.

In the same way, the transistors 235(i) of the array 210 have the drain terminals—identified with the same reference of the corresponding drain regions d'(0)-d'(3)—coupled to each other, and the source terminals—identified with the same reference of the corresponding source regions s'(0)-s'(3)—coupled to each other. As previously described, in the external index 140 corresponding to the coordinate (x=2, y=3) the gate terminals g'(0)-g'(2) are coupled to each other. Moreover, such gate terminals g'(0)-g'(2) are coupled to the drain terminals d'(0)-d'(3), while the gate terminal g'(3) is coupled to the source terminals s(0)-s(3).

The source terminals of both the arrays are further coupled to each other, in such a way to form a common source line.

According to an embodiment of the present disclosure, the drain terminals d(i), d'(j) and the source terminals s(i), s'(j) of the transistors of the arrays 205, 210 may be accessed from the outside of the die 110b integrating the external index 140 through proper contact pads integrated on the die. A first contact pad 294 is coupled to the drain terminals d(i) of the transistors 215(i) of the first array 205, and particularly to the drain line 250; a second contact pad 296 is coupled to the drain terminals d'(j) of the transistors 235(j) of the second array 210, particularly to the drain line 260; the source line 270—and, thus, the source terminals s(i), s'(j)—is instead coupled to a third contact pad 298.

The equivalent circuit of the arrays 205 and 210 corresponding to the considered example is illustrated in figure with the reference 292. By observing such circuit, it is possible to see that in the array 205 the transistors 215(2) and 215(3) have the gate terminals g(2), g(3) coupled to the source line 270, and the transistors 215(0) and 215(1) have the gate terminals g(0) and g(1) coupled to the drain line 250; in the array 215 the transistor 235(3) has the gate terminal g'(3) coupled to the source line 270, and the transistors 235(0), 235(1) and 235(2) have the gate terminals g'(0), g'(1) and g'(2) coupled to the drain line 260.

Generalizing, according to an embodiment of the present disclosure, in the external index 140 of a generic die 110b corresponding to a pair of coordinates (x=$x_0$, y=$y_0$):

the transistors 215($x_0$)-215(n) of the array 205 have the gate terminals g($x_0$)-g(n) coupled to the source line 270;

the transistors $235(y_0)$-$235(m)$ of the array 210 have the gate terminals g'($y_0$)-g'(m) coupled to the source line 270;

the transistors 215(0)-$215(x_0$–1) of the array 205 have the gate terminals g(0)-g($x_0$–1) coupled to the drain line 250, and the transistors 235(0)-$235(y_0$–1) of the array 210 have the gate terminals g'(0)-g'($y_0$–1) coupled to the drain line 260.

According to an embodiment of the present disclosure, given a generic die 110b, it is possible to trace back the coordinates (x=$x_0$, y=$y_0$) corresponding thereto by means of an electric measurement carried out on the arrays 205, 210 of the external index 140 integrated in such die 110b.

According to an embodiment, in order to determine the coordinate with respect to the x axis, the source line 270 is biased to a reference voltage—such as the ground voltage—while the drain line 250 is biased to a supply voltage Vdd of the die 110b.

Figure 6:
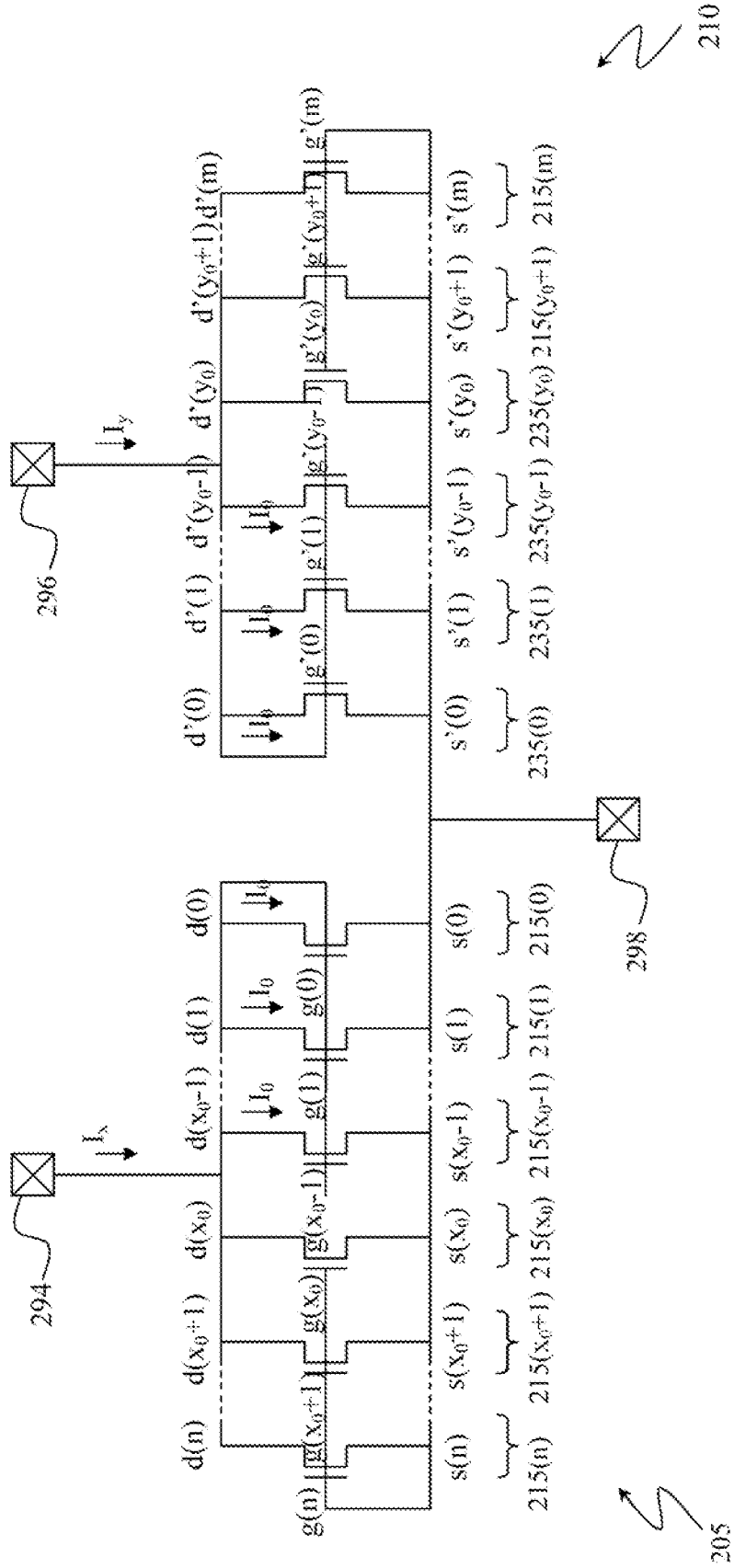
FIG. 6 shows an equivalent circuit of the external index according to an embodiment of the present disclosure.

In this situation, illustrated in FIG. 6, the transistors 215 ($x_0$)-215(n) of the array 205 are off, since the gate terminals g($x_0$)-g(n) are coupled to the source terminals s($x_0$)-s(n), which are biased to the ground voltage. The transistors 215 (0)-215($x_0$–1) of the array 205 are instead on, since the gate terminals g(0)-g($x_0$–1) are coupled to the drain terminals d(0)-d($x_0$–1), which are biased to the supply voltage Vdd. Supposing that each transistor 215(i) of the array 205 is dimensioned in such a way to absorb a current $I_0$ when the voltage difference between gate g(i) and source s(i) is equal to the supply voltage Vdd, the total current sunk by the array 205, identified with the reference Ix is substantially proportional to ($x_0$)·($I_0$).

In a similar way, the transistors $235(y_0)$-235(m) of the array 215 are off, since the gate terminals g'($y_0$)-g'(m) are coupled to the source terminals s'($y_0$)-s'(m), which are biased to the ground voltage. The transistors 235(0)-$235(y_0$–1) of the array 215 are instead on, since the gate terminals g'(0)-g'($y_0$–1) are coupled to the drain terminals d'(0)-d'($y_0$–1), which are biased to the supply voltage Vdd. Supposing that each transistor 235(j) of the array 215 is dimensioned in such a way to absorb a current $I_0$ when the voltage difference between gate g'(j) and source s'(j) is equal to the supply voltage Vdd, the total current sunk by the array 215, identified with the reference $I_y$ is substantially proportional to ($y_0$)·($I_0$).

As a consequence, in order to trace back the pair of coordinates (x=$x_0$, y=$y_0$) corresponding to a die 110b comprising an external index 140 of the type previously described, it is sufficient to properly bias the source line 270 and the drain lines 250, 260, and measure the currents sunk by the two arrays. Particularly, by knowing the value of the current $I_0$ sunk by each transistor, the coordinate $x_0$ is retrieved by dividing the measured value of the current $I_x$ by the value of the current $I_0$. In the same way, the coordinate $y_0$ is retrieved by dividing the measured value of the current $I_y$ by the value of the current I.

Making reference to the example illustrated in FIG. 5, the current $I_x$ sunk by the array 205 is given by the current sunk by the transistors 215(0) and 215(1), and it is thus equal to twice the value of the current $I_0$, while the current $I_y$ sunk by the array 210 is given by the current sunk by the transistors 235(0), 235(1) and 235(2), and it is thus equal to three times the value of the current Io. Dividing the two measured values by the value of the current $I_0$, it is deduced that in this case $x_0$ is equal to 2 and $y_0$ is equal to 3.

According to an embodiment of the present disclosure, the biasing voltages may be provided from the outside of the die 110b trough proper probes (not illustrated in figure) adapted to cooperate with the contact pads coupled to the external index 140. In this case, a first probe is placed in contact with the contact pad 298 for providing the ground voltage to the source line 270, a second probe is placed in contact with the contact pad 294 for providing the supply voltage Vdd to the drain line 250 of the array 205 and a third probe is placed in contact with the contact pad 296 for providing the supply voltage Vdd to the drain line 260 of the array 210. The current $I_x$ sunk by the array 205 is measured by measuring the current flowing through the probe in contact with the contact pad 294, while the current $I_y$ sunk by the array 210 is measured by measuring the current flowing through the probe in contact with the contact pad 296.

An embodiment has several advantages over the use of visible indexes. Indeed, the external index 140 may be read without having to open the package that encapsulate the examined die 110b, since the reading is performed by measuring a current flowing in a probe that is in electric contact with the contact pads, which contact pads may be accessed from the outside even in presence of packages encapsulating the die.

Moreover, being that it is not necessary to perform any visual inspection, since current measurements are sufficient, feasible through devices such as amperometers, an embodiment may be implemented in an automatic way. In this way it is possible to drastically reduce the costs—even in terms of employed time—of the dies inspection operations.

An embodiment may also be advantageous with respect to the known indexing methods which make use of non volatile memory elements adapted to store the information regarding the coordinates. Indeed, an embodiment does not require that memory cells are integrated in the dies, and thus does not require any expensive dedicated process. Moreover, since an embodiment requires only a current measure, feasible through a reading device which is outside the die—for example, an amperometer coupled to a probe—the active area occupation of the die may be reduced with respect to the case exploiting memory cells, since in order to read the information included in such memory cells, proper reading devices (to be integrated in the die) are required.

An additional advantage offered by an embodiment is that the internal index 140 may be considered a visible index, too, since the pair of coordinates (x,y) may by deduced through visible inspection by checking the positions of the interruptions on the gate lines 230, 245 of the arrays. In this way it is possible to retrieve the pair of coordinates (x,y) of the die 110b even in presence of defects that hinder one from carrying out the previously described current reading.

In order to further reducing the die's area occupied by the external index 140, it may be possible to not provide the use of dedicated contact pads for biasing the drain lines 250, 260 and for reading the current—such as the contact pads identified in the figures with the references 296, 294—but instead using contact pads of the integrated circuit 120 by means of proper switching circuits.

Although in a previously described embodiment the electronic components forming the arrays 205, 210 of the external index 140 are n-channel MOS transistors, these electronic components may be of a different type, such as p-channel MOS transistors, npn or pnp bipolar transistors, or resistors.

Figure 7:
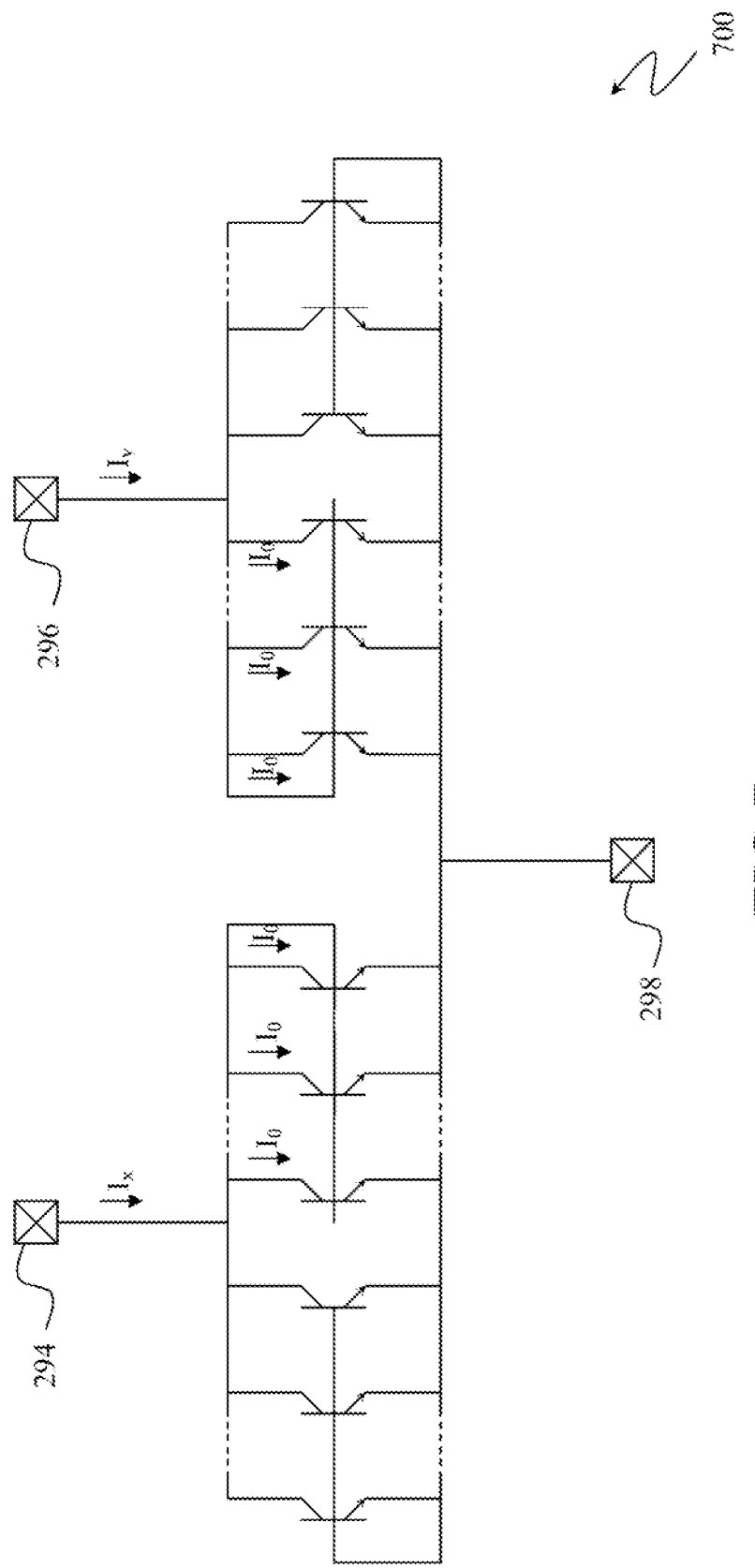
FIG. 7 shows an equivalent circuit of the external index according to an alternative embodiment of the present disclosure.

For example, according to an alternative embodiment of the present disclosure, the external index 140 may be formed by arrays of bipolar transistors. FIG. 7 shows the equivalent circuit 700 of a generic array formed by bipolar transistors, wherein the emitter terminals are coupled to each other by means of an emitter line for receiving a ground voltage and the collector terminals are coupled to each other by means of a collector line for receiving the supply voltage Vdd. In the same way as for the MOS transistors case, the base terminals of each array are coupled to each other by means of a common base line—for example, implemented in a metallic layer—having an end coupled to the collector line, and the other end coupled to the emitter line; during a particular stage of the manufacturing process, such line is interrupted in a point determined by the coordinates (x,y) of the die. Consequently, in the same way as for the previously described MOS transistors case, the pair of coordinates (x,y) may be read by measuring the total current sunk by each array; such array depends on the number of bipolar transistors of the array having the base terminals coupled to the collector line.

Figure 8:
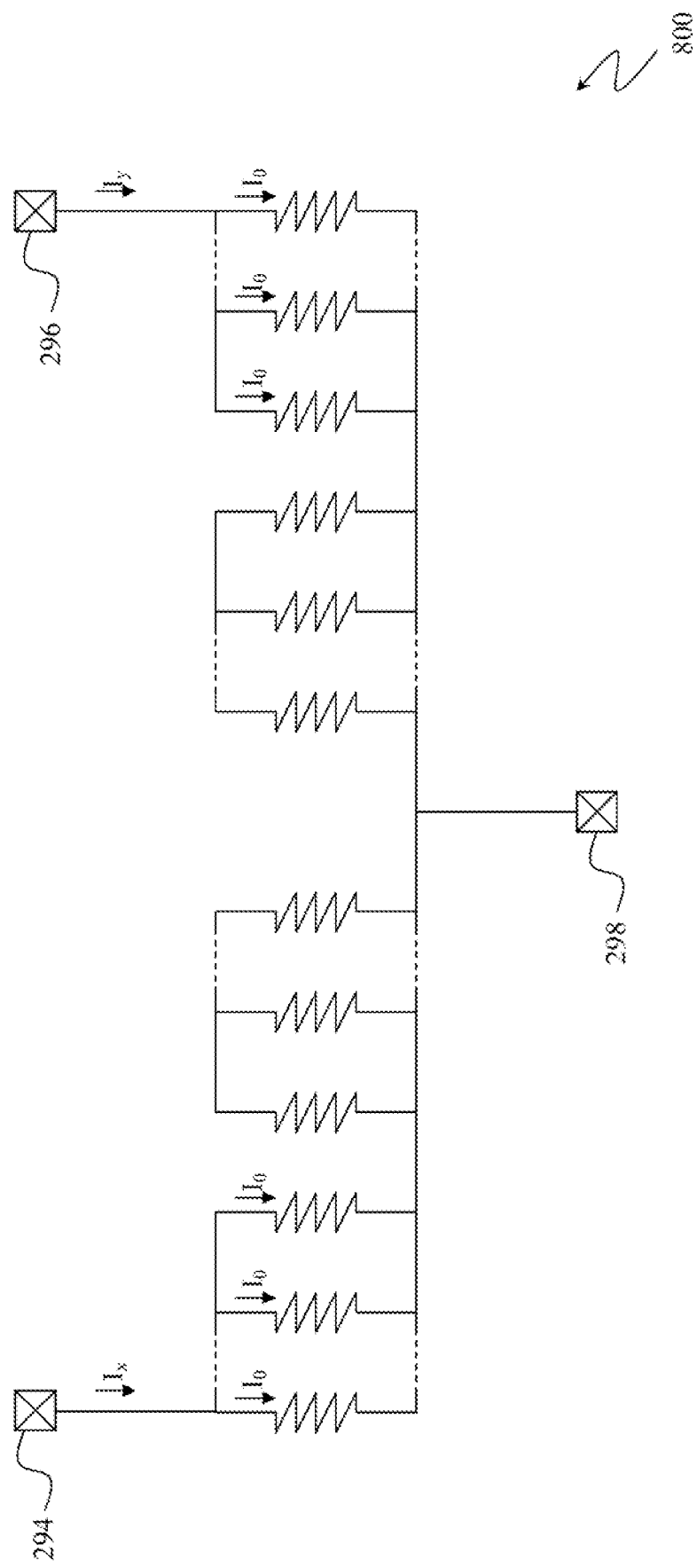
FIG. 8 shows an equivalent circuit of the external index according to a further alternative embodiment of the present disclosure.

According to a further embodiment of the present disclosure, the external index 140 is formed by arrays of resistors having the same resistance value, such as it is illustrated in FIG. 8 with the reference 800. In this case the resistors of each array have a first terminal coupled to a first common line for receiving a reference (e.g.) ground voltage, and a second terminal coupled to a second common line—for example formed in a metallic layer—for receiving the supply voltage Vdd; during a particular stage of the manufacturing process, such second line is interrupted in a point determined by the coordinates (x,y) of the die. In this way, the pair of coordinates (x,y) may be read by measuring the current sunk by each array; such current depends on the number of resistors of the array having the second terminal at the supply voltage Vdd.

According to an embodiment of the present disclosure, even the internal index 150 of the dies 110b, i.e., the index that allows to identify the position of the die itself with respect to the mask 105 may be implemented in a way similar to the internal index 140. Particularly, each internal index 150 may be implemented by means of a double array of electronic devices, such as MOS transistors, associating to each pair of such electronic devices a particular position within the mask 105.

Figure 9:
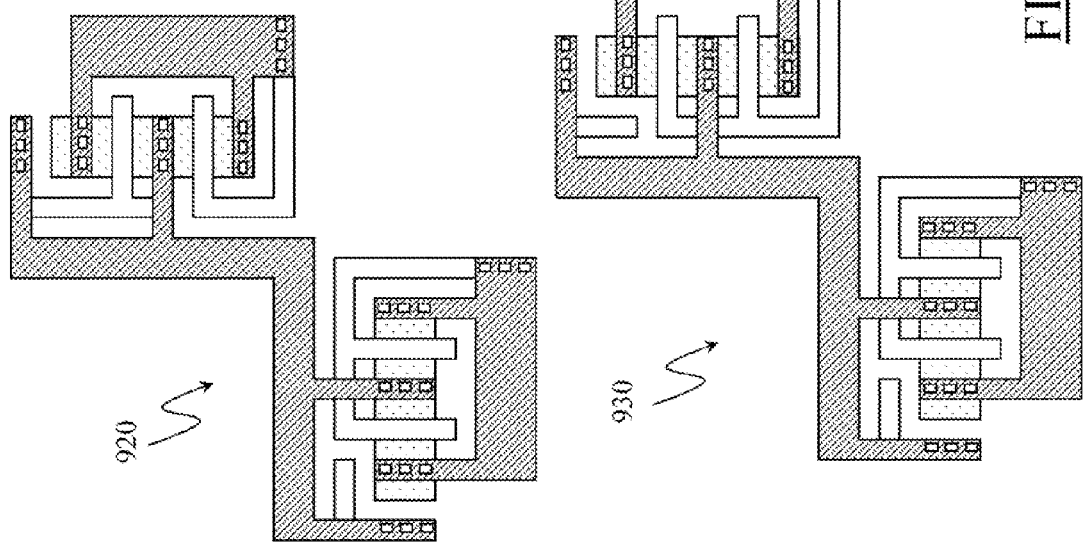
FIG. 9 shows an example of the final structure of internal indexes of the die obtainable according to an embodiment of the present disclosure.
Figure 9:
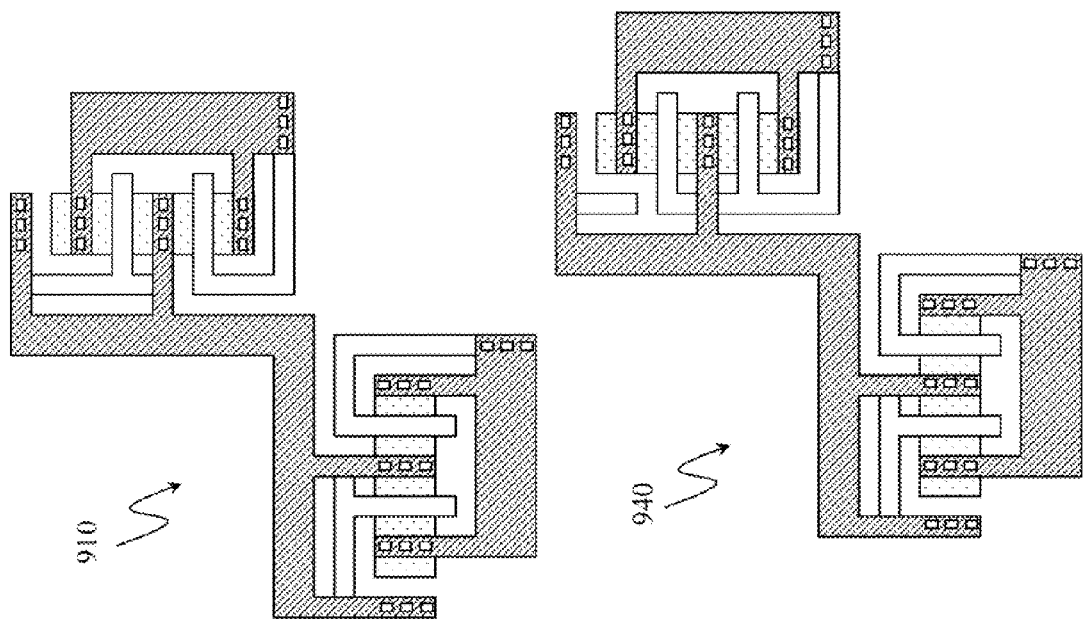

Without entering in details, being similar to the case of the external index 140, a possible implementation of the internal indexes 150 of a die 110b is illustrated in FIG. 9. Particularly, FIG. 9 makes reference to the example previously considered, wherein each mask 105 comprises four images 110a for the manufacturing of four dies 110b on the wafer 100. Since in this case the images 110a of a mask 105 are positioned according to a matrix arrangement, and particularly according to a matrix having two rows and two columns, a possible implementation of the external indexes 150 may provide the use of a double array formed by two MOS transistors. Particularly, with the reference 910 it is indicated a possible implementation of the internal index 150 corresponding to the image 110a positioned at the top left in the mask 105, with the reference 920 the one corresponding to the image positioned at the top right, with the reference 930 the one corresponding to the image positioned at the bottom right, and with the reference 940 the one corresponding to the image at the bottom left. In way similar to that of the external index 140, the line connecting the gate terminals of the transistors of each array is interrupted in a point determined by the position of the image 110a within the mask 105; such position may be thus identified by carrying out a measurement of the total current sunk by each array of the internal index 150. Analogous considerations may be applied in case the transistor's array of an external index are arranged in another way, for example with the arrays that are parallel to each other. Indeed, in order to form the internal index 150 it is not necessary to use an additional service mask provided with L shaped windows and positioning the two arrays in perpendicular directions, since the internal indexes 150 are replicated in an identical way at each step by only using the second reference images 180 of the mask 105.

Naturally, in order to satisfy local and specific requirements, one may apply to the embodiments described above many modifications and alterations. Particularly, although the present disclosure has been described with a certain degree of particularity with reference to embodiment(s) thereof, it should be understood that various omissions, substitutions and changes in the form and details as well as other embodiments are possible; moreover, it is expressly intended that specific elements and/or method steps described in connection with any disclosed embodiment of the disclosure may be incorporated in any other embodiment as a general matter of design choice.

For example, in order to simplify the operations during the indexing stage, the windows 320 of the service mask may be superimposed on the gates of the transistors of the arrays 205 and 210. In this way, the interruptions xi, yj on the gate lines 230 and 245 may be formed with an increased ease, by entirely removing the gate terminals of the transistors corresponding to the coordinates to be registered.

According to the convention employed in the exemplary embodiments described in the present document, the current $I_x$ sunk by the array 205 of an external index 140 corresponding to the coordinate $x=x_0$ is equal to $(x_0)(I_0)$, while the current $I_y$ sunk by the array 210 of an external index 140 corresponding to the coordinate $y=y_0$ is equal to $(y_0)(I_0)$. As a consequence, if $x_0=0$, the current $I_x$ sunk by the array 205 is null; in the same way, if $y_0=0$, the current $I_y$ sunk by the array 210 is null. However, such null values of current may be determined by possible defects in the control and/or biasing circuits of the die. As a consequence, in order not to confuse a current having a null value due to the pair of coordinates (0,0) with a current having a null value due to defects in the control and/or biasing circuits of the die, a possible solution may provide to employ a different convention, for example by associating to the coordinates of values equal to zero current values $I_x$, $I_y$ different than zero, and decreasing such current values as the coordinates values increase (without reaching null current values). In order to implement a convention of such type it may be sufficient to modify the structure of the external indexes 140 previously described, inverting the position of the contacts among the drain/source lines and the gate lines, i.e. contacting the drain line 250 to the gate line 230 at the end adjacent to the transistor associated with the highest coordinate of the array 205 (in the example at issue, the transistor 215(3)), and contacting the source line 280 to the gate line 230 at the end adjacent to the transistor associated to the lowest coordinate of the array 205 (in the example at issue, the transistor 215(0)). Similar considerations apply to the array 210.

Such a die may be packaged to form an integrated circuit, and may be coupled to another die that is part of the same integrated circuit, or that is part of a different integrated circuit, to form a system. For example, the other die may form at least part of a controller.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A method for indexing a plurality of dies obtainable from a material wafer comprising a plurality of stacked material layers, each die being obtained in a respective position of the wafer, the plurality of dies being obtained by means of a manufacturing process performed in at least one manufacturing stage using at least one lithographic mask for treating a surface of the material wafer through an exposition to a proper radiation, said at least one manufacturing process comprising at least two steps for treating a respective superficial portion of the material wafer that corresponds to a subset of said plurality of dies using the at least one lithographic mask through the exposition to the proper radiation in temporal succession, the method including providing a die index on each die which is indicative of the position of the respective die, said providing a die index on each die comprising forming an external index indicative of the position of the superficial portion of the material wafer corresponding to the subset of the plurality of dies including said die, said forming the external index comprising:
   forming in a set of material layers of the die a first reference structure that defines a mapping of the superficial portions of the wafer, said first reference structure comprising a plurality of transistors having control terminals electrically coupled to each other using a respective common control line; and
   interrupting the common control line in a position based on the position of the superficial portion corresponding to the subset of the plurality of dies including the die.

2. The method of claim 1, wherein said first reference structure identifies a reference system having a first and a second coordinates, and wherein the plurality of transistors includes a first array of transistors associated with the first coordinate and a second array of transistors associated with the second coordinate.

3. The method of claim 2, wherein said position of the superficial portion is associated with a corresponding pair of a first coordinate value and a second coordinate value, and wherein said interrupting the common control line based on the position of the superficial portion comprises:
   interrupting a first control line associated with the first array based on the first coordinate value, and
   interrupting a second control line associated with the second array based on the second coordinate value.

4. The method of claim 3, wherein:
   each transistor of the first array is associated with a respective first coordinate value of the first coordinate, and
   each transistor of the second array is associated with a respective second coordinate value of the second coordinate.

5. The method of claim 4, wherein each of said transistors further comprises a first and a second conduction terminals.

6. The method of claim 5, wherein:
   each transistor of the first array has the control terminal that is connected to the first control line, the first conduction terminal connected to a first biasing line for receiving a supply voltage and the second conduction terminal connected to a reference line for receiving a reference voltage, and
   each transistor of the second array has the control terminal that is connected to the second control line, the first conduction terminal connected to a second biasing line for receiving the supply voltage and the second conduction terminal connected to a reference line for receiving the reference voltage.

7. The method of claim 6, wherein:
   the first control line has a first end connected to the first biasing line and a second end connected to the reference line, and
   the second control line has a first end connected to the second biasing line and a second end connected to the reference line.

8. The method of claim 7, wherein said interrupting the first control line comprises interrupting the first control line in correspondence of the transistor of the first array associated with the first coordinate value, and wherein said interrupting the second control line comprises interrupting the second control line in correspondence of the transistor of the second array associated with the second coordinate value.

9. The method of claim 5, wherein the transistors comprise MOS transistors, and wherein the first and the second control lines are realized in a polysilicon layer.

10. A method for indexing a wafer including a plurality of dies, each die at a respective location on the wafer, comprising:
   providing a die index on each die which is indicative of the respective position of that die on the wafer, wherein providing comprises:
      forming in a first region of a given die a first plurality of transistors having control terminals which are electrically coupled to each other using a first common control line; and
      selectively severing the first common control line at a first location along said first common control line, wherein the first location is indicative of a first coordinate of the respective location of the given die on the wafer.

11. The method of claim 10, wherein providing further comprises:
   forming in a second region of the given die a second plurality of transistors having control terminals which are electrically coupled to each other using a second common control line; and
   selectively severing the second common control line at a second location along said second common control line, wherein the second location is indicative of a second coordinate of the respective location of the given die on the wafer.

12. The method of claim 11, further comprising electrically connecting the first and second common control lines.

13. The method of claim 11, further comprising orienting portions of the first and second common control lines which are selectively severed perpendicular to each other.

14. The method of claim 10, wherein forming comprises:
   forming the first plurality of transistors having conduction paths which are connected in series; and
   forming control electrodes for said plurality of transistors which extend from the first common control line.

15. The method of claim 14, wherein selectively severing comprises selectively cutting through the first common control line between adjacent ones of the control electrodes.

16. The method of claim 14, wherein the transistors are MOS transistors.

17. The method of claim 14, wherein the transistors are bipolar transistors.

18. The method of claim 10, wherein forming comprises:
   forming the first plurality of transistors having conduction paths which are connected in parallel; and
   forming control electrodes for said plurality of transistors which extend from the first common control line.

19. The method of claim 18, wherein selectively severing comprises selectively cutting through the first common control line between adjacent ones of the control electrodes.

20. The method of claim 18, wherein the transistors are MOS transistors.

21. The method of claim 18, wherein the transistors are bipolar transistors.

* * * * *